US012771360B2

(12) United States Patent
Sahu et al.

(10) Patent No.: US 12,771,360 B2
(45) Date of Patent: Oct. 20, 2026

(54) VOLTAGE-CONTROLLED OSCILLATOR DEVICES

(71) Applicant: TEXAS INSTRUMENTS INCORPORATED, Dallas, TX (US)

(72) Inventors: Debapriya Sahu, Bangalore (IN); Ashlesha Yerramsetty, Bangalore (IN); Srinivas Veeramreddi, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 19/004,948

(22) Filed: Dec. 30, 2024

(65) Prior Publication Data

US 2026/0189237 A1 Jul. 2, 2026

(51) Int. Cl.

*H03L 7/099* (2006.01)
*H03F 3/21* (2006.01)
*H03L 7/093* (2006.01)

(52) U.S. Cl.

CPC ............... *H03L 7/099* (2013.01); *H03F 3/21* (2013.01); *H03L 7/093* (2013.01)

(58) Field of Classification Search

CPC ........................................ H03L 7/099
USPC ........................................ 331/1 R
See application file for complete search history.

(56) References Cited

U.S. PATENT DOCUMENTS

| | | | | |
|---|---|---|---|---|
| 10,666,274 | B2 * | 5/2020 | Jung | H03B 5/1228 |
| 2011/0300813 | A1 * | 12/2011 | Mirzaei | H04B 1/40 455/78 |
| 2015/0065068 | A1 * | 3/2015 | Mattsson | H01F 27/2804 336/200 |
| 2015/0364242 | A1 * | 12/2015 | Aboush | H03B 5/1212 336/192 |

OTHER PUBLICATIONS

Chen et al, "An 8-12.5-GHz LC PLL with Dual VCO and Noise-Reduced LDO Regulator for Multilane Multiprotocol SerDes in 28-nm CMOS Technology" Electronics 2021, 10, 1686, published on Jul. 14, 2021.

* cited by examiner

*Primary Examiner* — Joseph Chang
(74) *Attorney, Agent, or Firm* — Michelle F. Murray; Charles F. Koch

(57) ABSTRACT

A device comprising a first planar coil and a second planar coil. The first planar coil includes a first plurality of conductive loop segments that are concentric with one another and centered on a first axis. The first axis is spaced laterally from a first side of a plane by a first distance, and the first axis extends in parallel with the plane. The second planar coil is coupled to the first planar coil. The second planar coil includes a second plurality of conductive loop segments that are concentric with one another and centered on a second axis. The second axis extends in parallel with the first axis, and is spaced laterally from a second side of the plane by the first distance. The second side is opposite from the first side. The first planar coil is symmetric to the second planar coil about the plane.

20 Claims, 10 Drawing Sheets

VOLTAGE-CONTROLLED OSCILLATOR DEVICES

TECHNICAL FIELD

The present disclosure relates generally to an electronic system, and, in particular embodiments to voltage-controlled oscillator devices.

BACKGROUND

A voltage-controlled oscillator (VCO) receives an input voltage and provides an output signal whose frequency is based on the input voltage. Thus, varying the input voltage provided to the VCO can produce a varying output frequency.

SUMMARY

In accordance to an embodiment, a device includes: a first coil including a first plurality of conductive loop segments that are concentric with one another and centered on a first axis, the first coil including first and second terminals, and a center tap disposed between the first and second terminals of the first coil, where the first axis is spaced laterally from a first side of a plane by a first distance, the first axis extending in parallel with the plane; a second coil including a second plurality of conductive loop segments that are concentric with one another and centered on a second axis, the second coil including first and second terminals, and a center tap disposed between the first and second terminals of the second coil, the second axis extending in parallel with the first axis and spaced laterally from a second side of the plane by the first distance, the second side being opposite the first side; a first conductive segment electrically directly connecting the first terminal of the first coil to the first terminal of the second coil; and a second conductive segment electrically directly connecting the second terminal of the first coil to the second terminal of the second coil.

In accordance to an embodiment, a device includes: a first oscillator disposed in a substrate; a second oscillator disposed in the substrate; and an inductive structure including: a first loop disposed within the substrate and electrically coupled to the first oscillator, and a second loop disposed within the substrate and electrically coupled to the second oscillator, where the second loop is electrically shorted to the first loop, where a first circuit element of the first oscillator is disposed in a first area that is within the inductive structure, and where a second circuit element of the second oscillator is disposed within a second area that is within the inductive structure.

In accordance to an embodiment, a device includes: a transmit path including: a first mixer; a first amplifier having an input coupled to an output of the first mixer; and a transformer having an input coupled to an output of the first amplifier; and a phase locked loop (PLL) having an output coupled to the first mixer, where the PLL includes a first coil and a second coil, and where a center of the transformer is equidistant from respective centers of the first and second coils.

In accordance to an embodiment, a device includes: a first planar coil including a first plurality of conductive loop segments that are concentric with one another and centered on a first axis, the first axis spaced laterally from a first side of a plane by a first distance, and the first axis extending in parallel with the plane; and a second planar coil coupled to the first planar coil, the second planar coil including a second plurality of conductive loop segments that are concentric with one another and centered on a second axis, the second axis extending in parallel with the first axis and spaced laterally from a second side of the plane by the first distance, the second side being opposite the first side, where the first planar coil is symmetric to the second planar coil about the plane.

In accordance to an embodiment, a device includes: an amplifier disposed in a substrate and having an input; a first oscillator disposed in the substrate and having an output coupled to the input of the amplifier; a second oscillator disposed in the substrate and having an output coupled to the input of the amplifier; a first loop disposed within the substrate, the first loop coupled to the first oscillator; and a second loop disposed within the substrate and coupled to the first loop, the second loop coupled to the second oscillator, and symmetric to the first loop about a plane, where the first oscillator and the second oscillator are arranged symmetrically distributed across the plane.

In accordance to an embodiment, a system includes: a digital circuit having an output terminal; a mixer having a first input terminal, a second input terminal, and an output terminal, the first input terminal of the mixer coupled to the output terminal of the digital circuit; an amplifier having an input terminal, a first output terminal, and a second output terminal, the input terminal of the amplifier coupled to the output terminal of the mixer; a transformer having a first input terminal, a second input terminal, and an output terminal, the first input terminal of the transformer coupled to the first output terminal of the amplifier, the second input terminal of the transformer coupled to the second output terminal of the amplifier, the output terminal of the transformer coupled to an antenna terminal; and a phase locked loop (PLL) having an output terminal coupled to the second input terminal of the mixer, and where the phase locked loop includes a first coil and a second coil, where a center of the first coil is spaced from a center of the transformer by a first distance, a center of the second coil is spaced from the center of the transformer by a second distance, and where an absolute difference between the first distance and the second distance is less than 10 micrometers.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate relevant aspects of preferred embodiments and are not necessarily drawn to scale.

DETAILED DESCRIPTION

The making and using of the embodiments disclosed are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The description below illustrates various specific details to provide an in-depth understanding of several example embodiments according to the description. The embodiments may be obtained without one or more of the specific details, or with other methods, components, materials and the like. In some cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events.

Figure 1:
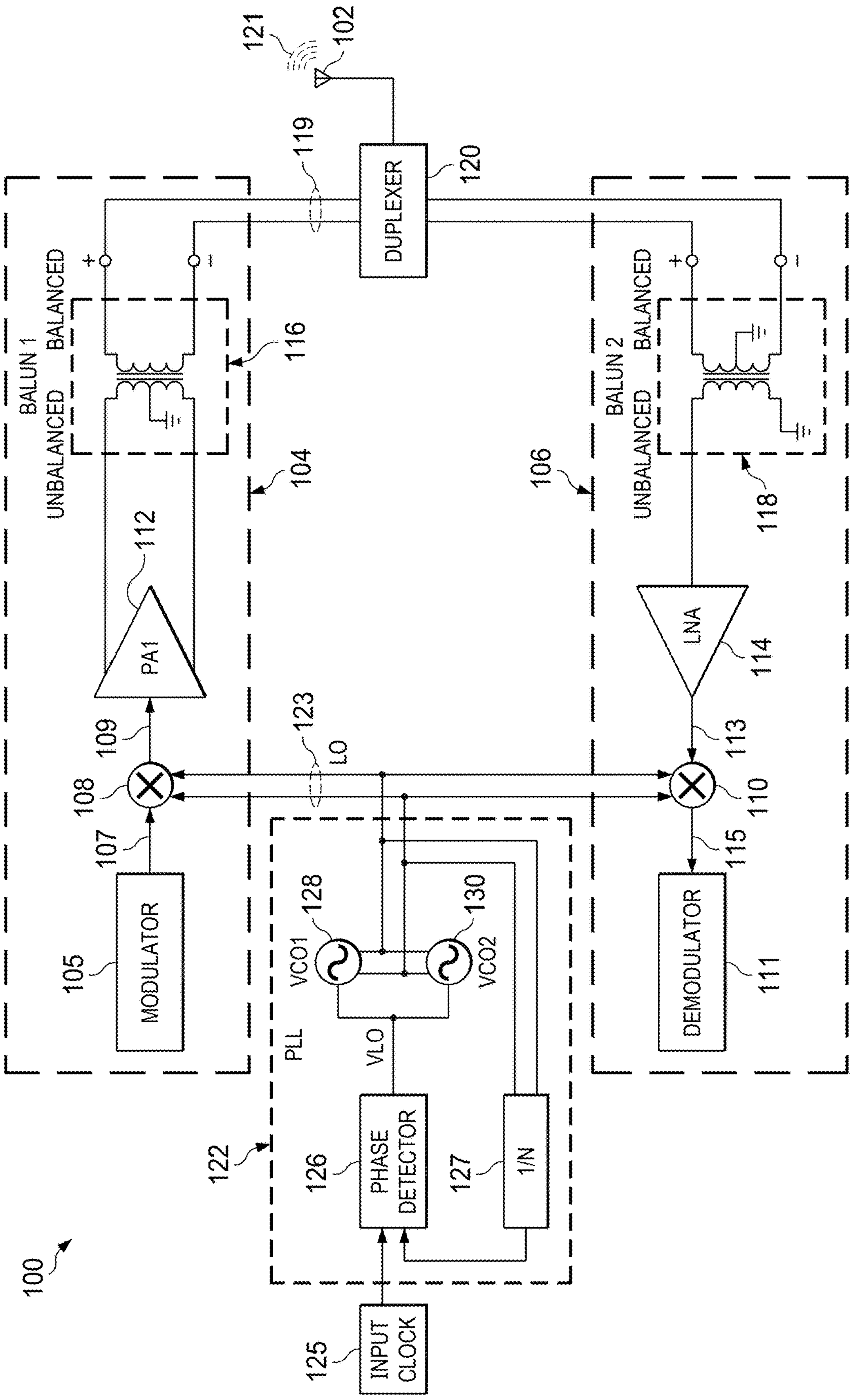
FIG. 1 shows an example block diagram of a transceiver, in accordance to an embodiment of the present disclosure.

FIG. 1 illustrates a transceiver 100 in accordance with some embodiments. The transceiver 100 transmits data over an antenna 102 using a transmission path 104, and receives data over the antenna 102 via a reception path 106. The transmission path 104 includes a modulator 105, a first mixer 108, a first amplifier 112, and a first balun 116. The reception path 106 includes a second balun 118, a low-noise amplifier 114, a second mixer 110, and a demodulator 111. A duplexer 120 couples the antenna 102 to the first balun 116 and second balun 118. The first and second baluns 116, 118 can take many different forms, but in some cases, each can include a transformer that includes a primary winding coupled to their respective amplifier and a secondary winding coupled to the duplexer 120, or vice versa. A phase-locked loop (PLL) 122 includes a first voltage-controlled oscillator (VCO) 128 and a second VCO 130, which are advantageously coupled together as described further herein. The input clock 125 provides an input to the PLL 122.

The PLL 122 includes a phase detector 126, the first VCO 128, the second VCO 130, and a frequency divider 127. The phase detector 126 receives a first input from the input clock 125, and a second input from the frequency divider 127. The frequency divider 127 receives an input from the outputs of the first and second VCOs 128, 130. The output of the phase detector 126 is coupled to the inputs of the first and second VCOs 128, 130. Additionally, other components may be between the output of the input clock 125 and the first input of the phase detector 126, or between the output of the phase detector 126 and the input of the first and second VCOs 128, 130, or between the output of the first and second VCOs 128, 130 and the second input of the phase detector 126. For example, there may be other frequency dividers, filters, or other signal processing components between the aforementioned inputs and outputs. The first and second VCOs 128, 130 may have a common output 123 (e.g., including a pair of differential signals) that is coupled to respective inputs of the first and second mixers 108, 110. Specifically, the first VCO 128 and second VCO 130 provide a local oscillator (LO) signal on the common output 123 to the first mixer 108 and second mixer 110. The first mixer 108 up-converts a baseband (BB) or intermediate frequency (IF) signal 107 provided by the modulator 105 to an RF signal 109. The second mixer 110 down-converts an amplified received RF signal 113 from the low-noise amplifier 114 to an IF or BB signal 115 provided to the demodulator 111. For example, during a phone call, the user's voice may be represented with digital data, which includes a BB or IF signals 107. In order to transmit this data effectively, the first mixer 108 multiples the frequency of the BB or IF signal 107 by the frequency of the LO signal on 123 to shift the BB/IF signal 107 to a higher frequency band (e.g., radio frequency (RF)). The first mixer 108 then provides this RF signal 109 to the first amplifier 112, and an amplified RF signal 119 is provided to the first balun 116, which is coupled to the antenna 102, to transmit a wireless RF signal 121. Reception of data occurs in an analogous manner with reception and down-conversion.

The frequency of the output LO signal of some VCOs may be susceptible to fluctuations, e.g., caused by noise, temperature variations, process inconsistencies, and/or interference from other on-chip components. For example, when the transceiver is operating, there can be electromagnetic coupling on the transmission path 104 between a VCO of the PLL, and the first and/or second amplifier 112, 114 or the first and/or second balun 116, 118. For example, the LO signal 123 may have a target frequency of 2.4 GHz, and the output of the first balun 116 may have an output with a frequency of 2.4 GHz, which may result in undesired coupling between them.

Aspects of the present disclosure provide for an improved PLL 122 that includes first and second VCOs 128, 130 (referred herein as "twins" or "twin VCOs"). As can be appreciated in more detail herein, in some embodiments, "twin" VCOs 128, 130 are coupled together to have a common output 123 and make use of inductor coils that are symmetric with regards to one another, which may advantageously result in a PLL 122 being less susceptible to noise, which may advantageously result in the frequency of output LO being more stable than other PLL circuits. In some embodiments, PLL 122 being less susceptible to noise may advantageously allow for LO signal 123 having a frequency that may be the same as the transmission frequency of the first amplifier 112 (propagated via first balun 116, duplexer 120 and antenna 102) and reception frequency (from antenna 102, via duplexer 120, to second balun 118 and amplifier 114), or a multiple thereof. Therefore, aspects of the present disclosure may advantageously result in PLLs and transceivers with increased reliability, and/or having a lower footprint (e.g., as circuitry for using LO signal 123 having a frequency different from the RF frequency used by elements 112, 116, 118, 114 may be avoided).

In some embodiments, the inductor coils of VCOs 128 and 130 have a "dumb-bell" shaped layout that is symmetric about a midline of the layout when viewed from above.

Figure 2A:
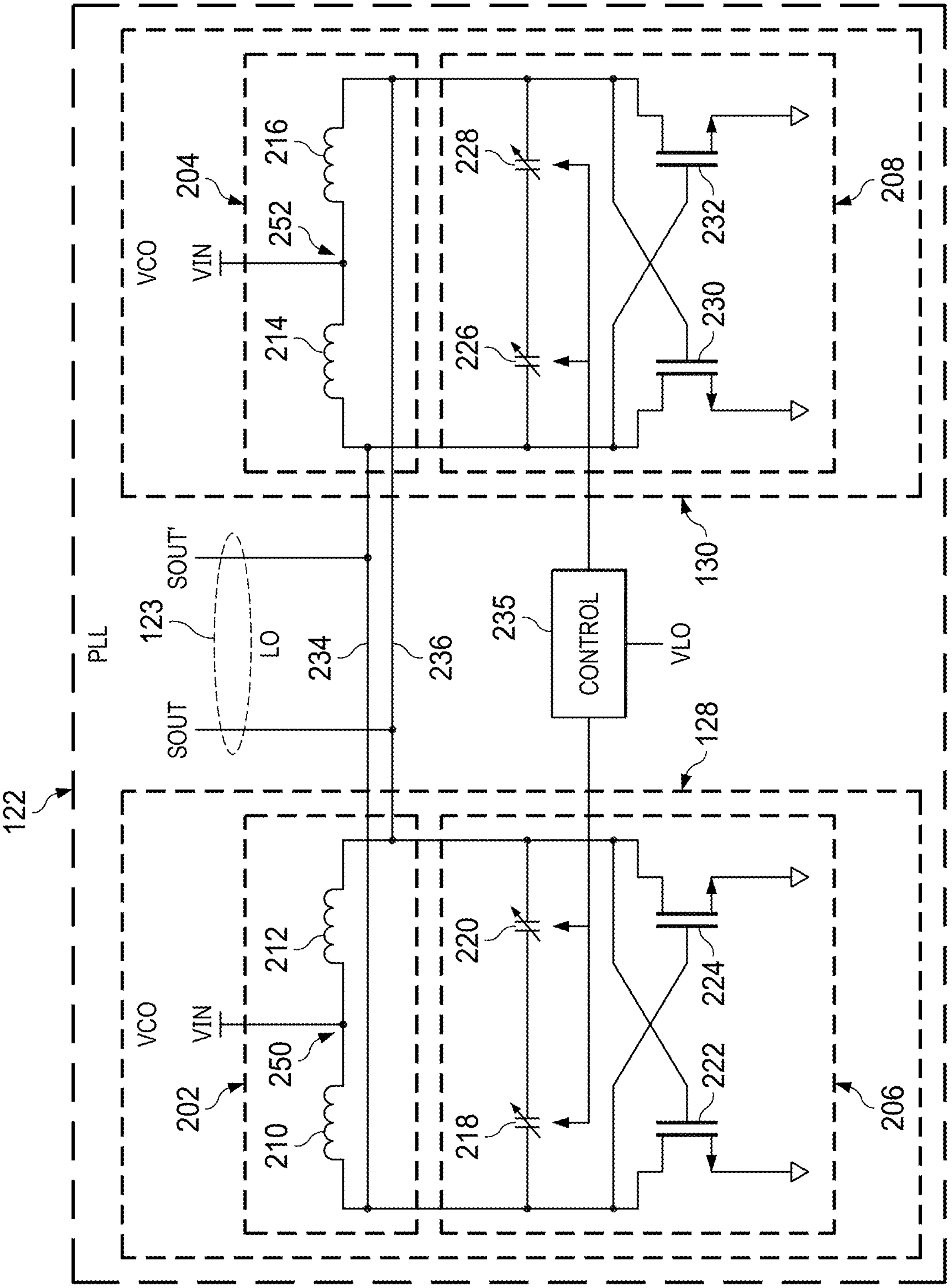
FIG. 2A shows an example of a schematic view of a portion of a phase-locked loop that includes a dual-VCO architecture, in accordance to an embodiment of the present disclosure.

FIG. 2A shows an example implementation of a portion of a PLL 122 that includes "twin" VCOs, including first VCO 128 and second VCO 130, according to an embodiment of this disclosure. The first VCO 128 includes a first coil 202 and a first variable-capacitance switching circuit 206; and the second VCO 130 includes a second coil 204 and a second variable-capacitance switching circuit 208. The first coil 202 includes a first inductor coil 210 and a second inductor coil 212, and the second coil 204 includes a third inductor coil 214 and a fourth inductor coil 216. The first variable-capacitance switching circuit 206 includes a first variable capacitor 218, a second variable capacitor 220, a first transistor 222, and a second transistor 224. The second variable-capacitance switching circuit 208 includes a third variable capacitor 226, a fourth variable capacitor 228, a third transistor 230, and a fourth transistor 232.

Within the first VCO 128, the first variable capacitor 218 has a terminal coupled to the second variable capacitor 220. The first transistor 222 has a first terminal coupled to a terminal of the first inductor coil 210, to the first conductive segment 234, and to one terminal of the first variable capacitor 218. The second transistor 224 has a terminal coupled to the other terminal of the second inductor coil 212, to the second conductive segment 236, and to a terminal of the second variable capacitor 220. The first transistor 222 and the second transistor 224 have second terminals coupled to ground. The first transistor 222 and the second transistor 224 both have gate terminals coupled to each other's drain terminals. The variable capacitors and inductors in the second VCO 130 have similar connections to the variable capacitors and inductors in the first VCO 128. A control circuit 235 provides control signals to adjust the capacitance of the variable capacitors 218, 220, 226, 228, based on a varying input local oscillator (LO) voltage level, VLO.

In some embodiments, control circuit 235 may be implemented with and general purposes or custom controller or processor, which may be coupled to a memory and configured to execute instructions from such memory. In some embodiments, control circuit 235 may be implemented with a field programmable gate array (FPGA). In some embodiments, control circuit 235 includes a state machine.

The first inductor coil 210 has a first terminal coupled to an internal rail that receives an input voltage (VIN), such as VDD, and the second inductor coil 212 also has a terminal coupled to the internal rail. The third inductor coil 214 and the fourth inductor coil 216 have a similar structure to the first inductor coil 210 and the second inductor coil 212. Also, the outer terminals of the first inductor coil 210 and the second inductor coil 212 are coupled to the outer terminals of the third inductor coil 214 and the fourth inductor coil 216 by a first conductive segment 234 and the second conductive segment 236. The first conductive segment 234 and second conductive segment 236 correspond to common output 123, on which a differential LO signal (Sout, Sout') is provided. Thus, any coupled current can flow entirely within a loop between the first VCO 128 and the second VCO 130 without going through any of the other components such as the variable capacitors or transistors.

Figure 2B:
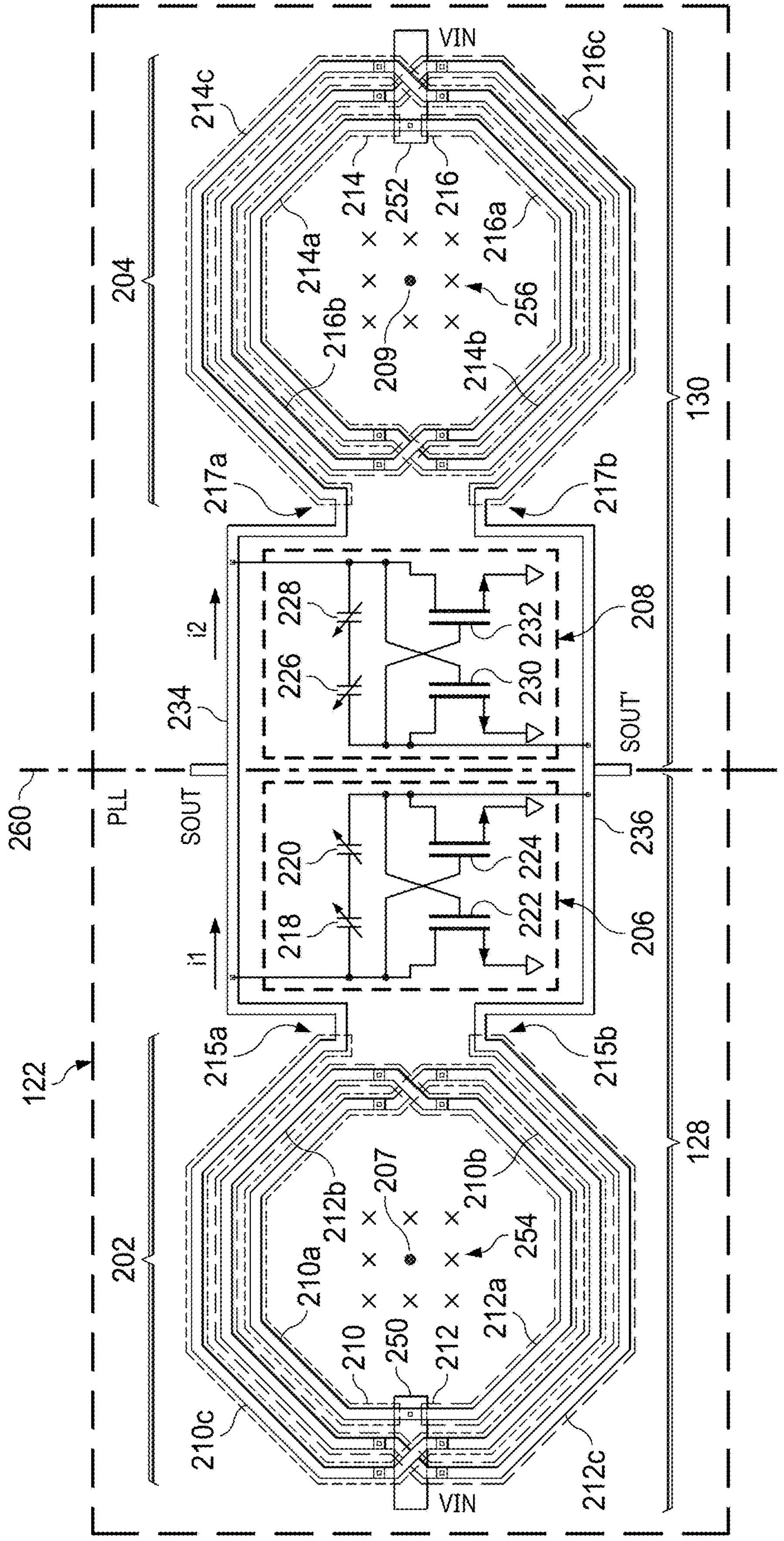
FIG. 2B shows an example of a top-down view consistent with the schematic view of FIG. 2A, in accordance to an embodiment of the present disclosure.

FIG. 2B illustrates a layout view of the portion of the PLL schematic of FIG. 2A, according to an embodiment of the present disclosure. The first coil includes first inductor coil 210 and second inductor coil 212, which are made up of conductive loop segments that are intertwined with one another. The second coil 204 includes third inductor coil 214 and fourth inductor coil 216, which are also made up of conductive loop segments that are intertwined with one another.

More particularly, the first inductor coil 210 and second inductor coil 212 have a plurality of conductive loop segments (e.g., 210*a*, 210*b*, 210*c*, and 212*a*, 212*b*, 212*c*, respectively) that are concentric about a first axis 207. The third inductor coil 214 and fourth inductor coil 216 have a plurality of conductive loop segments (e.g., 214*a*, 214*b*, 214*c*, and 216*a*, 216*b*, 216*c*, respectively) that are concentric about a second axis 209. In some embodiments, the first axis 207 and the second axis 209 are parallel to one another and extend perpendicularly into and out of FIG. 2A, and are positioned at centers of the first coil 202 and the second coil 204, respectively. The first coil 202 and the second coil 204 also have a plurality of conductive structures coupling respective conductive loop segments. The conductive structures may be vias that extend between layers, and/or may be connecting segments (e.g., metal lines or traces) that are above or below the conductive loop segments. The first coil 202 has first and second terminals 215*a*, 215*b* coupled to the first and second conductive segments 234, 236, respectively. Similarly, the second coil 204 has first and second terminals 217*a*, 217*b* coupled to the first and second conductive segment 234, 236, respectively.

The first center tap 250 is coupled at a first end of the first coil 202. The first center tap 250 is coupled to VIN. The second center tap 252 is positioned on a second end of the second coil 204 furthest from the first end of the first coil 202. The second center tap 252 is coupled to VIN.

In some embodiments, the first conductive segment 234 and the second conductive segment 236 may be positioned within the same metal layer of an integrated circuit, or alternatively in different metal layers of an integrated circuit.

In some embodiments, the first conductive segment 234 and the second conductive segment 236 may be positioned within the same metal layer of a printed circuit board (PCB), or positioned in different metal layers of a PCB.

In some embodiments, the first conductive segment 234 is parallel to the second conductive segment 236. The first variable-capacitance switching circuit 206 and the second variable-capacitance switching circuit 208 (e.g., all of components 218, 220, 222, 224, 226, 228, 230, and 232) may each be positioned in an area between the first conductive segment 234 and the second conductive segment 236 (e.g., on top of the same substrate as coils 202 and 204). In a top-down view (e.g., as shown in FIG. 2B), the first variable-capacitance switching circuit 206 and the second variable-capacitance switching circuit 208 are laterally surrounded by the combination of the first coil 202, the first conductive segment 234, the second conductive segment 236, and the second coil 204. The first conductive segment 234 and the second conductive segment 236 may have equal lengths to one another. In some embodiments, the length may be between 0 micrometers and 100 micrometers, such as between 20 micrometers and 50 micrometers.

In some embodiments, the first coil 202, the second coil 204, the first conductive segment 234, and the second conductive segment 236 may be or comprise copper, aluminum or another metal. In some embodiments, the first coil 202, the second coil 204, the first conductive segment 234, and the second conductive segment 236 may be or comprise doped polysilicon or other conductive material.

An axis of symmetry 260, which corresponds to a plane that extends vertically and in/out of FIG. 2B, is positioned such that the first coil 202 and the second coil 204 are arranged symmetrically on opposite sides the axis of symmetry 260. Thus, the conductive loop segments within the first coil 202 are symmetric to the conductive loop segments of the second coil 204. Also, the conductive structures of the first coil 202 and second coil 204 are symmetric with one another. The first conductive segment 234 and the second conductive segment 236 are bisected by the axis of symmetry 260, such that the first conductive segment 234 and the second conductive segment 236 have equal parts arranged symmetrically on opposite sides of the axis of symmetry 260. The first variable-capacitance switching circuit 206 and the second variable-capacitance switching circuit 208 are also symmetric about the axis of symmetry 260.

A first magnetic flux 254 and a second magnetic flux 256 are shown as "X" marks such that magnetic field lines point into the figure. A first current i1 may flow through the first coil 202 and induces the first magnetic flux 254. A second current i2 may flow through the second coil 204 and induces the second magnetic flux 256. Currents i1 and i2 point in the same direction and are approximately equal to each other due to the symmetry. Thus, in some embodiments, the currents do not cancel out, and instead circulate around the first coil 202 and the second coil 204. Because the currents circulate, the currents do not travel through either of the first variable-capacitance switching circuit 206 or the second variable-capacitance switching circuit 208. Thus, the first VCO 128 and the second VCO 130 may advantageously have reduced noise, or equivalently, an increase in signal-to-noise ratio.

In some embodiments, due to the symmetry about the axis of symmetry 260, the first coil 202 and the second coil 204 have a substantially equal inner diameters and outer diameters as one another. For example, the outer radial distance from the first axis 207 to an outermost edge of the first coil 202 and the outer radial distance from the second axis 209 to an outermost edge the second coil 204 may each be equal, and may range between 1 micrometer and 100 micrometers, such as between 2 micrometers and 50 micrometers. Further, although the terms "diameter" and "radius" (and/or derivations thereof) in some context may relate exclusively to circles, in the present application the terms "diameter", radius and the like can be extended to relate to polygonal shapes, which can have multiple linear segments and/or rounded segments. Thus, although the first coil 202 and the second coil 204 are shown as piece-wise linear conductive segments that form a polygon (e.g., an octagon) when viewed from above, the first coil 202 and the second coil 204 may alternatively be circular, and/or have curved or rounded coils/segments. Although the first coil 202 and the second coil 204 are shown as planar, in other embodiments the first and second coils can be helical coils or have any other suitable coil shape.

Further still, although the first coil 202 and the second coil 204 are each shown in FIG. 2B as having three concentric rings, the first coil 202 and the second coil 204 may have a different number of concentric rings. For example, the first coil 202 and the second coil 204 may have between 1 ring and 10 concentric rings, such as between 3 rings and 5 concentric rings.

FIGS. 3A-3D illustrate another embodiment of a portion of a PLL 122 including first and second VCOs 128, 130, according to an embodiment of the present disclosure. FIGS. 3A-3D may be understood in view of FIGS. 2A-2B.

Figure 3A:
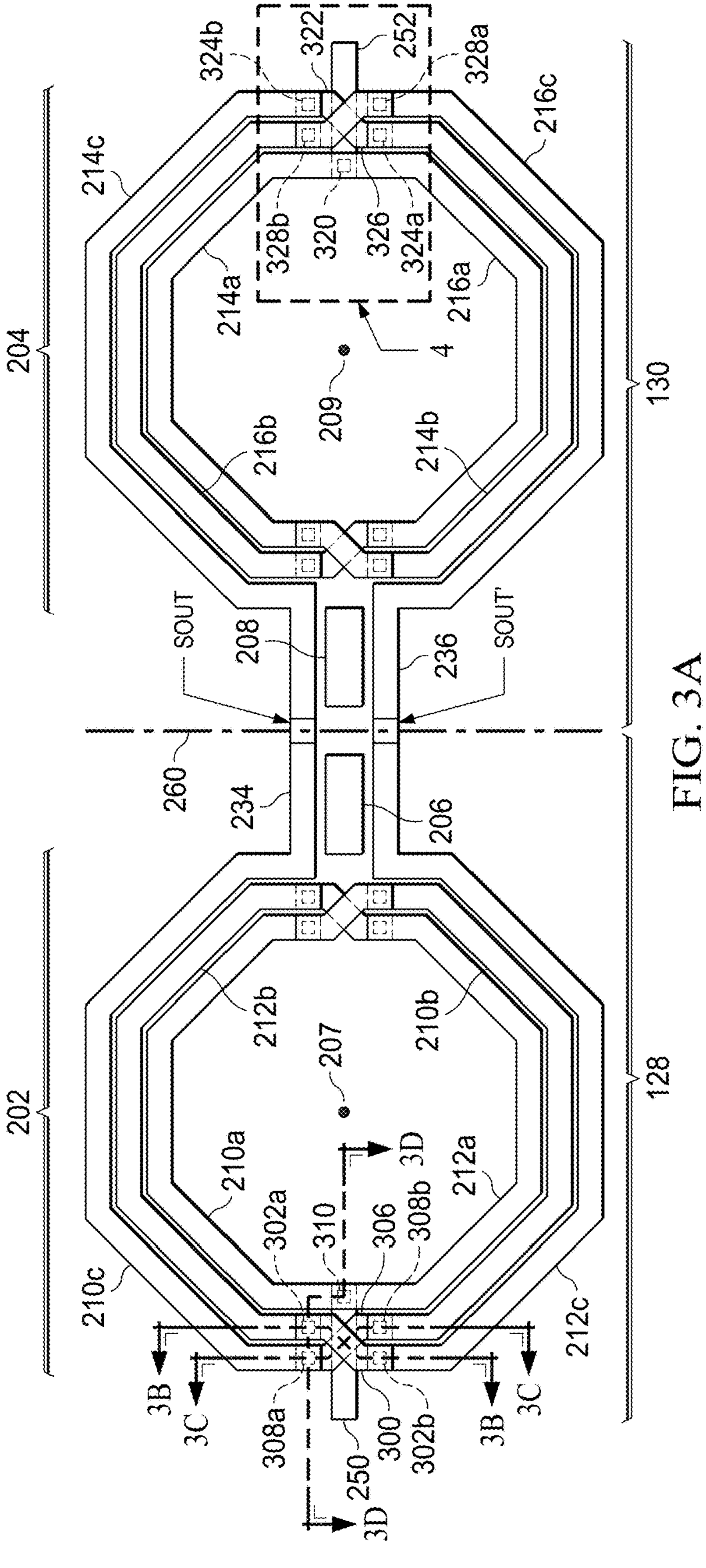
FIG. 3A shows another example top-down view of a dual-VCO architecture, in accordance to an embodiment of the present disclosure.

In FIG. 3A, the first coil 202 is illustrated as including a first inductor coil and a second inductor coil, which are made up of conductive loop segments (e.g., 210*a*, 210*b*, 210*c*, and 212*a*, 212*b*, 212*c*, respectively). The second coil 204 is illustrated as including a third inductor coil and a fourth inductor coil, which are made up of conductive loop segments (e.g., 214*a*, 214*b*, 214*c*, and 216*a*, 216*b*, 216*c*, respectively). The conductive loop segments of the first inductor coil are concentric about first axis 207, and the conductive loop segments of the second inductor coil are concentric about second axis 209. First conductive segment 234 and second conductive segment 236 extend continuously between nearest neighboring edges of the first coil 202 and second coil 204. First center tap 250 and second center tap 252 are positioned at outermost edges of the first coil 202 and second coil 204, respectively.

Referring now to FIGS. 3A-3D, one can see the first conductive loop segment 210*a*, second conductive loop segment 210*b*, third conductive loop segment 210*c*, fourth conductive loop segment 212*a*, fifth conductive loop segment 212*b*, and sixth conductive loop segment 212*c* all lie within the same metal layer over a substrate 350.

In some embodiments, the substrate 350 can be a semiconductor substrate, such as a monocrystalline silicon substrate, silicon-on-insulator (SOI) substrate, or III-V semiconductor substrate, for example.

Figure 3B:
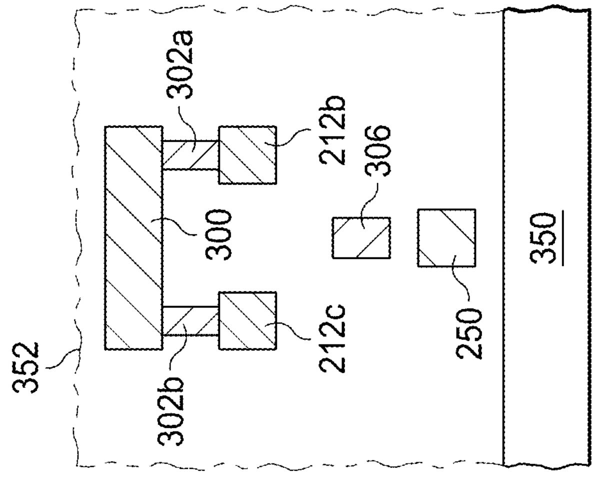
FIGS. 3B, 3C, and 3D show various cross-sectional views of the dual-VCO architecture of FIG. 3A, in accordance to an embodiment of the present disclosure.
Figure 3C:
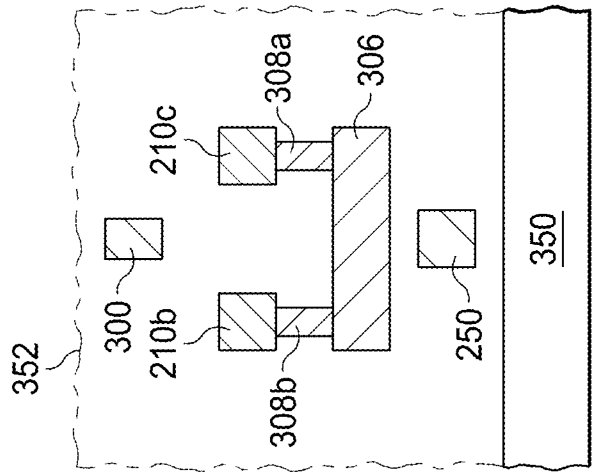
Figure 3D:
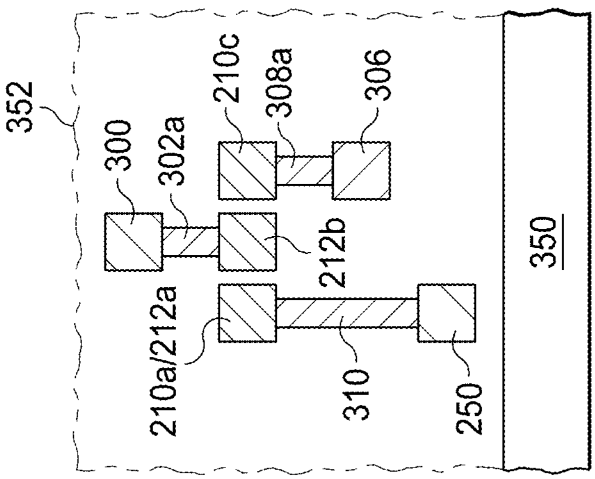

As shown, dielectric material 352 is disposed over the substrate 350 and surrounds the various conductive loop segments. A seventh conductive segment 300 couples conductive loop segments 212*b*, 212*c* to one another through vias 302*a*, 302*b* (as shown in FIGS. 3A, 3B). An eighth conductive segment 306 couples conductive loop segments 210*b*, 210*c* to one another through vias 308*a*, 308*b* (as shown in FIGS. 3A, 3C). The seventh conductive segment 300 crosses over the eighth conductive segment 306. Another via 310 couples the first and fourth conductive loop segments 210*a*, 212*a* to the first center tap 250 (as shown in FIGS. 3A, 3D).

Figure 4:
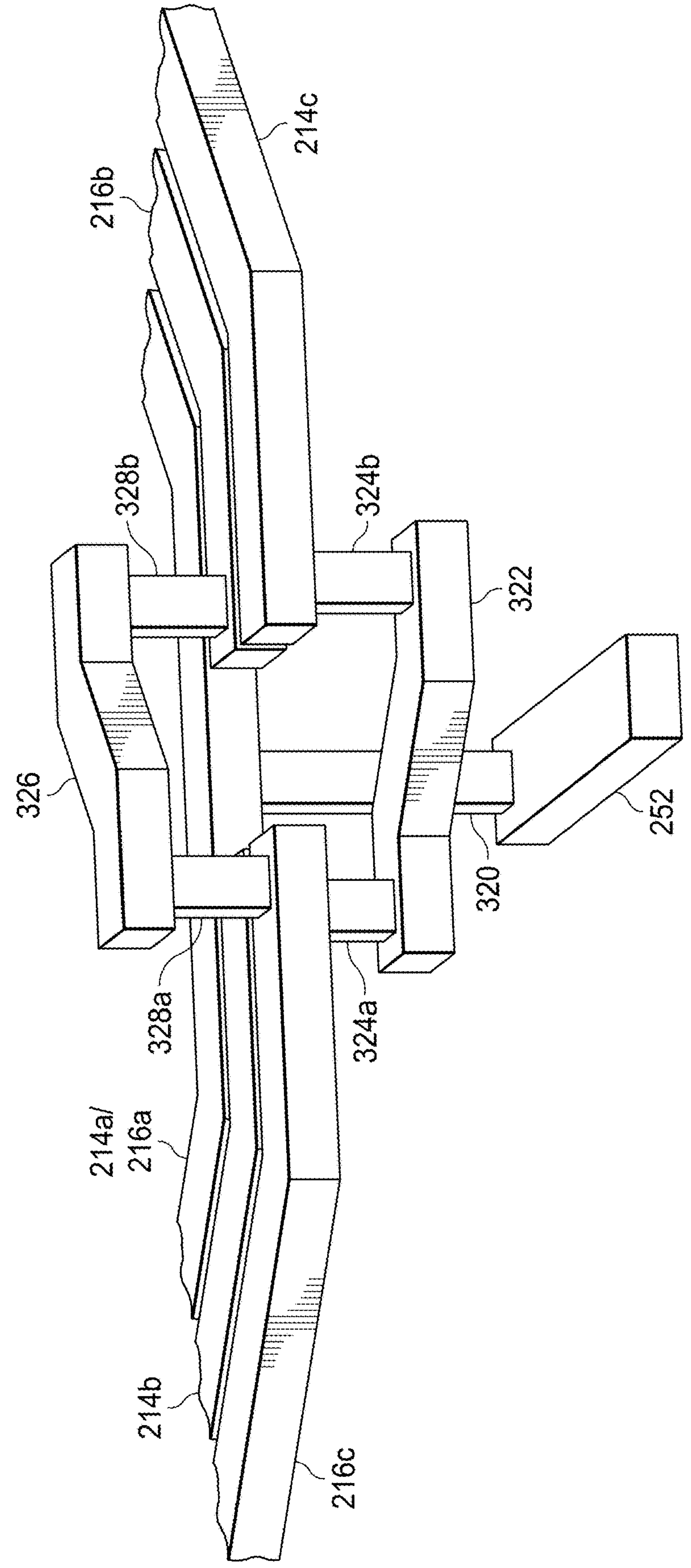
FIG. 4 shows a three-dimensional view of a portion the dual-VCO architecture of FIG. 3A, in accordance to an embodiment of the present disclosure.

FIG. 4 shows a perspective view of various connections on the right-hand side of the second coil 204 in FIG. 3A, according to an embodiment of the present disclosure. These connections are similar or identical (e.g., in mirror image) to the connections in the left-hand side of the first coil 202, such that the various conductive loop segments, vias, and conductive segments are symmetric for the first and second coils 202, 204 about the axis of symmetry 260. This symmetry is advantageous in that it may help reduce noise and/or maintains a stable LO frequency for the output LO signal 123, which may be provided in differential format by signals Sout, Sout'. FIG. 4 shows vias 320, 324*a*, 324*b*, 328*a*, 328*b*

It will be appreciated that while vias are used to illustrate one way in which the different conductive segments can be coupled to each other, the coupling may also be performed by any other suitable conductive structure that extends between different layers of an integrated circuit or a printed circuit board.

Figure 5:
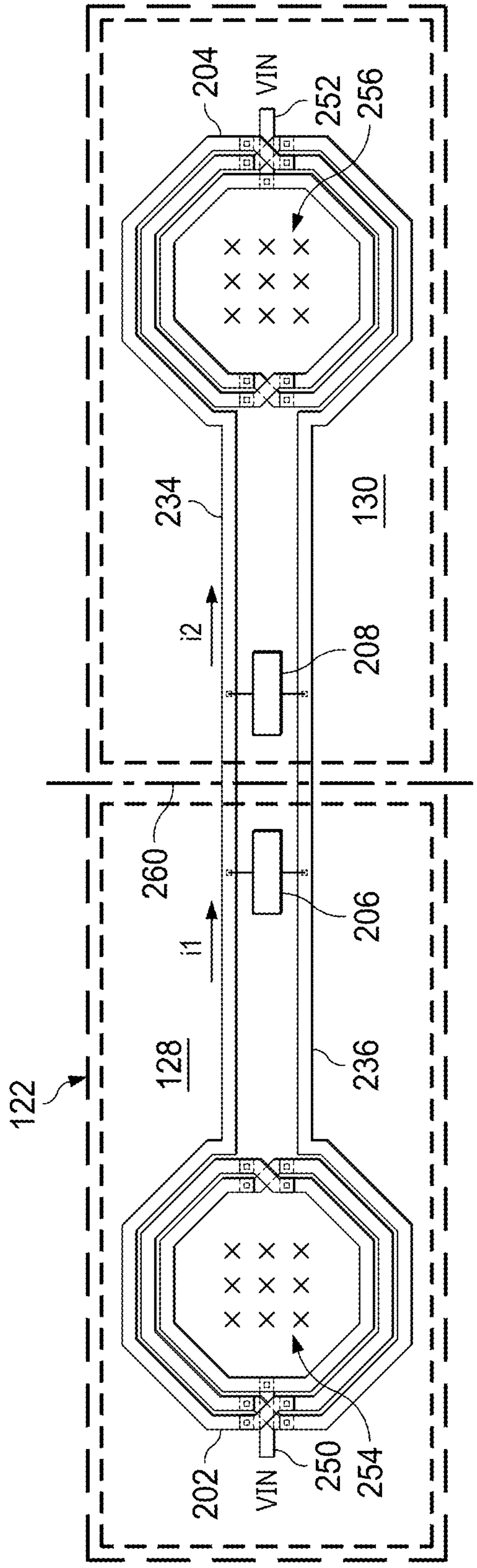
FIG. 5 shows another example top-down view of a dual VCO architecture, in accordance to an embodiment of the present disclosure.

FIG. 5 shows another example of a portion of a PLL 122 consistent with FIG. 2 and FIG. 3A, in accordance with an embodiment of the present disclosure. Compared with FIG. 2 and FIG. 3A, FIG. 5 has fewer labels for easier viewing.

Figure 6:
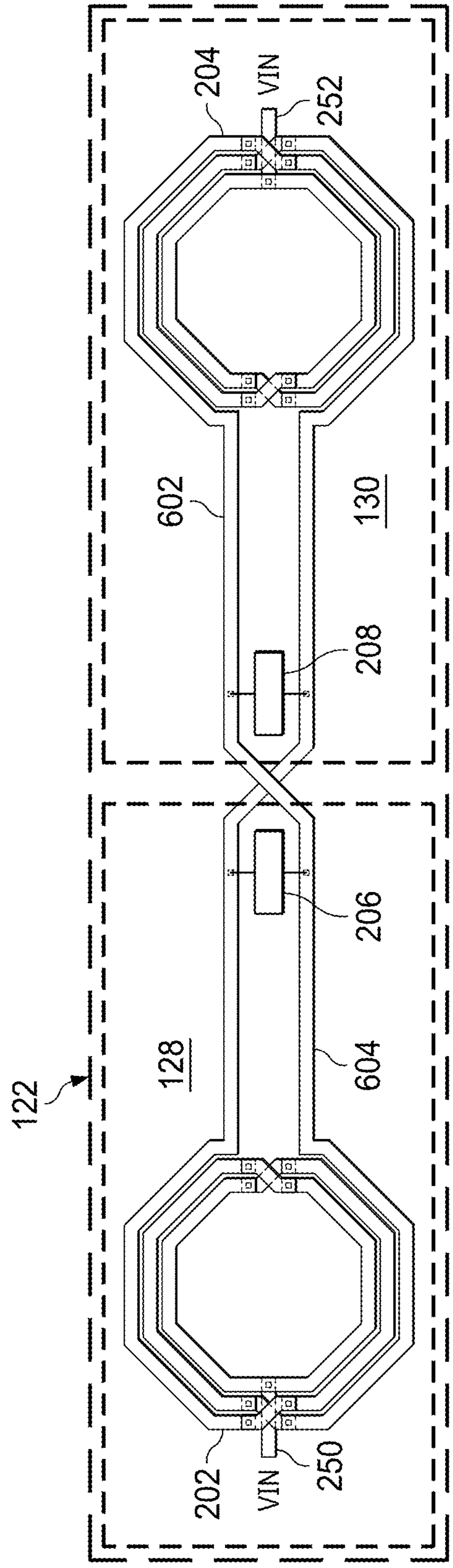
FIG. 6 shows another example top-down view of a dual VCO architecture, in accordance to an embodiment of the present disclosure.

FIG. 6 shows another example of a portion of a PLL 122, according to an embodiment of the present disclosure. This example contains a third conductive segment 602 and a fourth conductive segment 604. The third conductive segment 602 and the fourth conductive segment 604 may cross each other in the middle of the structure. For example, the third conductive segment 602 may cross over the fourth conductive segment 604. Alternatively, the fourth conductive segment 604 may cross over the third conductive segment 602. Thus, any induced currents would cancel, as opposed to circulating around the first coil 202 and the second coil 204.

In some embodiments, e.g., derived from FIG. 5 or 6, the first variable-capacitance switching circuit 206 may be arranged within an inner diameter of the first coil 202, and the second variable-capacitance switching circuit 208 may be arranged within an inner diameter of the second coil 204. In some such embodiments, such as in some embodiments derived from FIG. 6, the first coil 202 may still be coupled to the second coil 204 by the third conductive segment 602 and fourth conductive segment 604, similar to as shown in FIG. 6.

Figure 7:
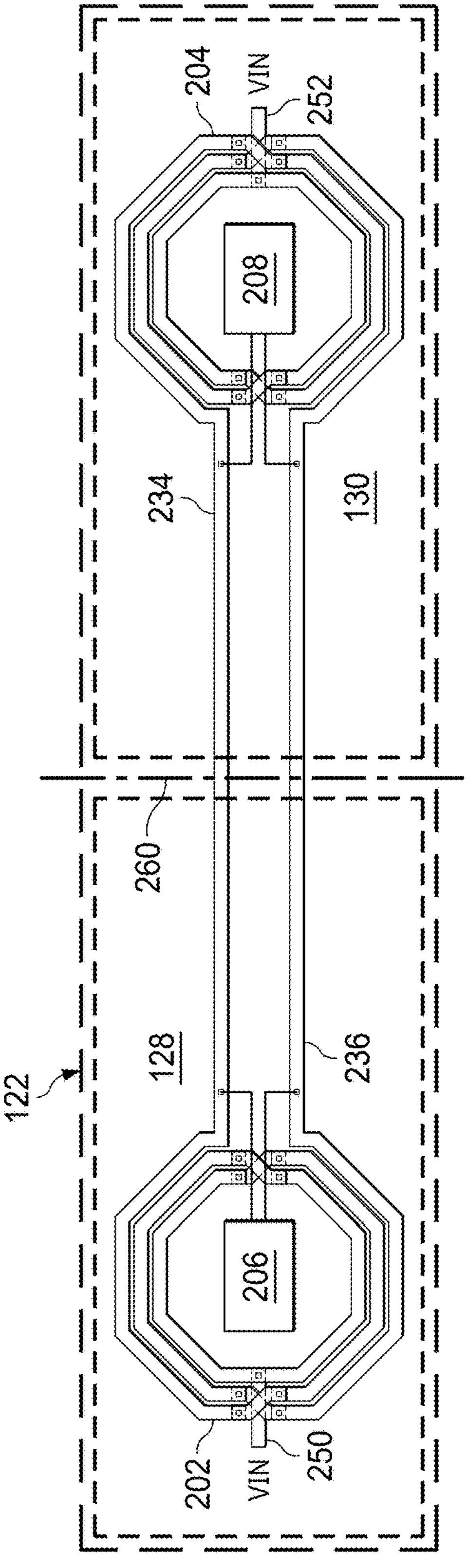
FIG. 7 shows another example top-down view of a dual VCO architecture, in accordance to an embodiment of the present disclosure.

FIG. 7 shows an example of a portion of a PLL 122, according to an embodiment of the present disclosure. In this example, the first variable-capacitance switching circuit 206 and the second variable-capacitance switching circuit 208 are laterally surrounded by the first coil 202 and the second coil 204, respectively. This layout may advantageously provide additional noise reduction.

Figure 8:
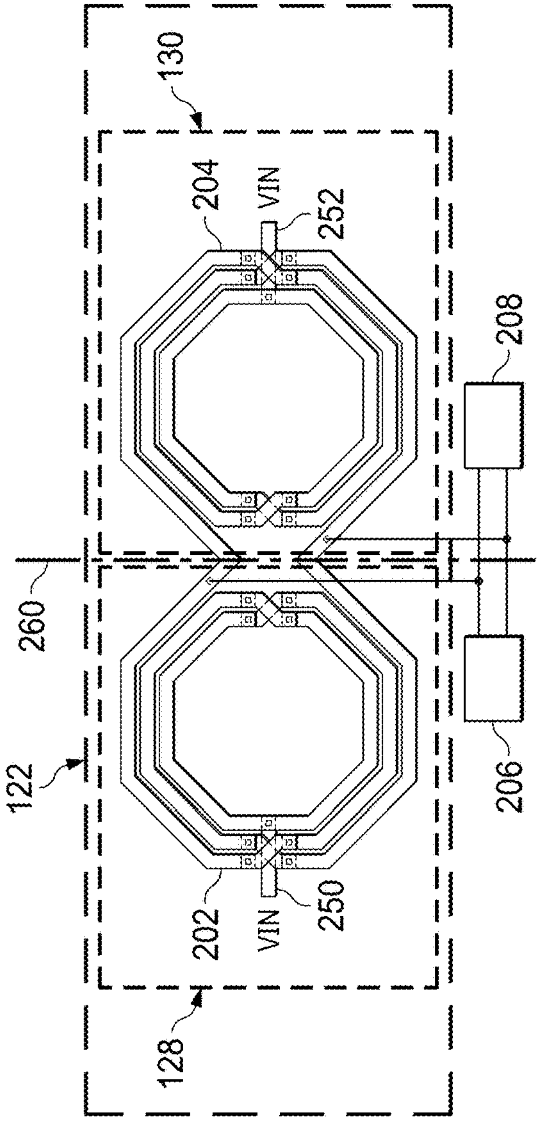
FIG. 8 shows another example top-down view of a dual VCO architecture; in accordance to an embodiment of the present disclosure

FIG. 8 shows an example of a portion of a PLL 122 where the first coil 202 and the second coil 204 are directly adjacent to each other, according to an embodiment of the present disclosure. In some such embodiments, the first variable-capacitance switching circuit 206 and the second variable-capacitance switching circuit 208 may be positioned outside of the first coil 202 and the second coil 204. The example shown in FIG. 8 may be combined with any of the other examples described above. For example, the first variable-capacitance switching circuit 206 of FIG. 8 may be positioned in an area surrounded by the first coil 202, and the second variable-capacitance switching circuit 208 of FIG. 8 may be positioned in an area surrounded by the second coil 204, such as previously shown in FIG. 7.

Figure 9:
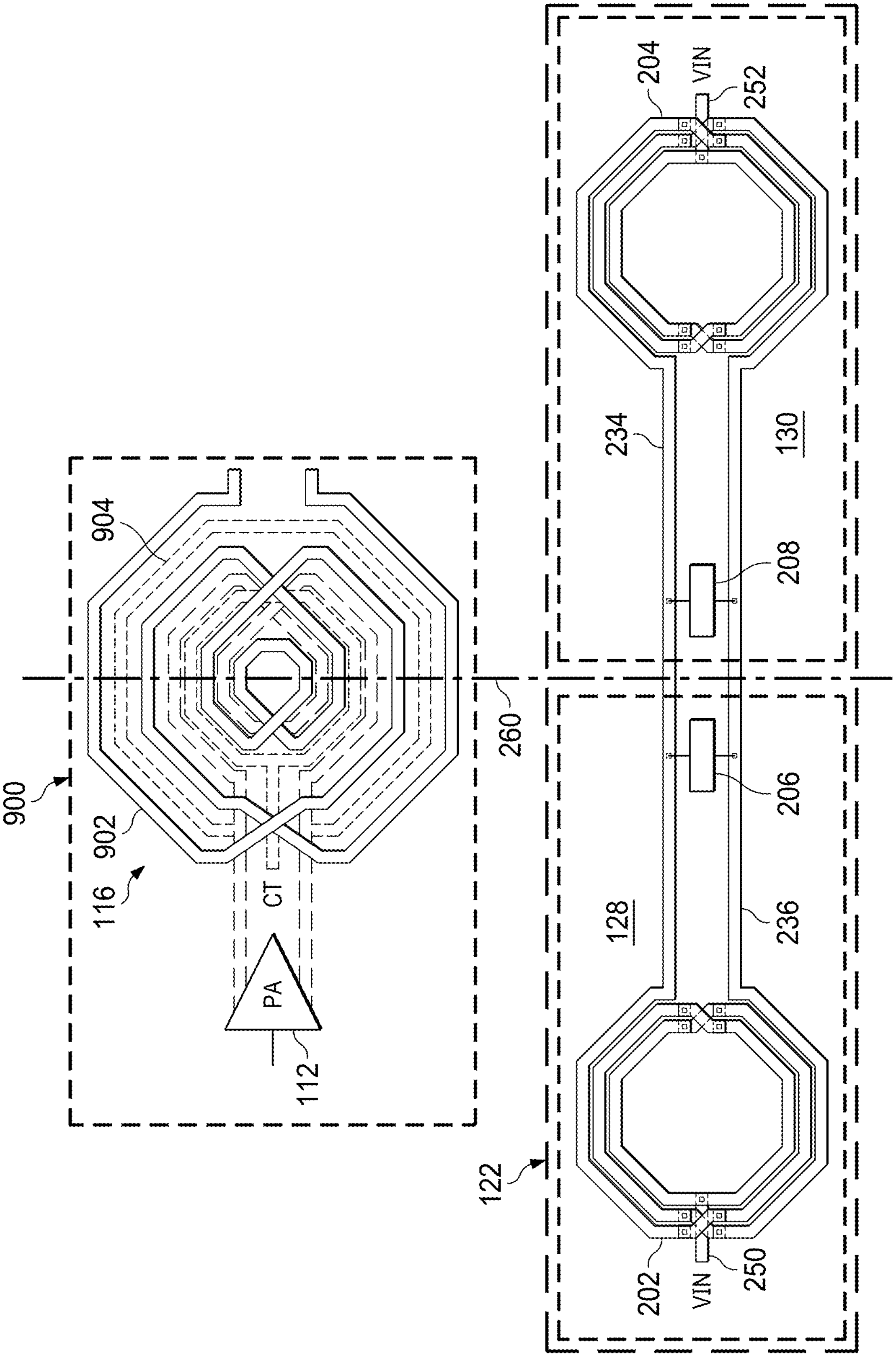
FIG. 9 shows an example top-down view of a dual VCO architecture that is arranged to be asymmetric with regards to a noise-generating circuit, in accordance to an embodiment of the present disclosure.

FIG. 9 shows an example layout of a portion of a PLL 122 and a noise-generating circuit 900, according to an embodiment of the present disclosure. The noise-generating circuit 900 may, for example, contain the first amplifier 112 and the first balun 116, as shown in FIG. 9. Noise-generating circuit 900 may include, additionally or alternatively, other components, such as the second balun 118 and amplifier 114, for example.

The first amplifier 112 is coupled to the first balun 116. The axis of symmetry 260 is shown asymmetric with regards to the first amplifier 112 and the first balun 116. The first balun 116 may be positioned in the same layer as the first coil 202 and the second coil 204, or positioned in a different layer compared to the first coil 202 and the second coil 204.

In FIG. 9, the first balun 116 contains a first winding 902, a second winding 904, and a center tap (CT) coupled to the second winding 904. The first winding 902 is shown as a solid line, and the second winding 904 is shown as a dotted line for illustrative purposes. In some embodiments, the first winding 902 and the second winding 904 are predominately in the same plane except for where they cross each other. The combination of the first winding 902 and the second winding 904 may create an electromagnetic coupling to the PLL 122, which PLL 122 may advantageously reduce, e.g., due to the symmetric properties of VCOs 128 and 130.

While FIG. 9 shows an example of a first balun 116, other geometries or shapes of baluns may also be used. Also, the balun may be replaced with any pair of coils that couple such as a transformer.

As shown in FIG. 9, the inputs of the first balun 116 that couple to the first amplifier 112 are parallel to each other, and to the first conductive segment 234. The first balun 116 may be spaced from the first coil 202 or the second coil 204 by a distance. For example, the distance may be between 1 and 1000 micrometers, such as between 100 and 500 micrometers.

Figure 10:
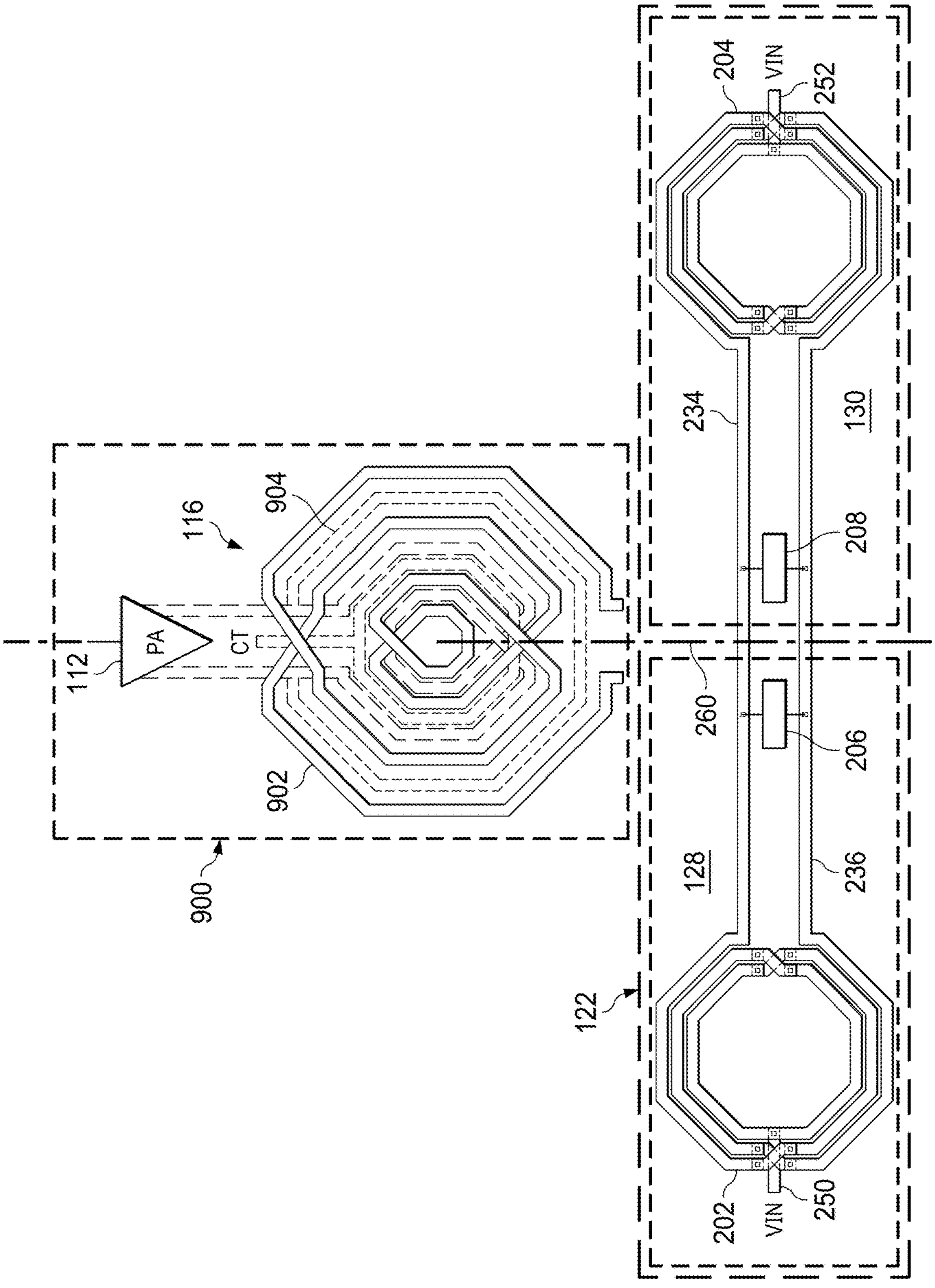
FIG. 10 shows an example top-down view of a dual VCO architecture that is arranged to be symmetric with regards to a noise-generating circuit, in accordance to an embodiment of the present disclosure.

FIG. 10 shows an example layout of a portion of a PLL 122 with the noise-generating circuit 900, according to an embodiment of the present disclosure. The noise-generating circuit 900 contains the first amplifier 112 and the first balun 116. In this example, the axis of symmetry 260 is shown to be symmetric with regards to the first amplifier 112 and the first balun 116. So, the center of the first balun 116 is equidistant from both the center of the first coil 202 and the center of the second coil 204. Due to tolerances of manufacturing, the distance between the center of the first balun 116 and the center of the first coil 202 may be within some predetermined percentage (e.g., 1% to 10%, such as between 3% and 5%) of the distance from the center of the first balun 116 and the center of the second coil 204. For example, the distance from the center of the first balun 116 to the center of the first coil 202 may be within 10 micrometers of the distance between the center of the first balun 116 and the center of the second coil 204. The inputs of the first balun 116 that couple to the first amplifier 112 are parallel to each other.

The symmetry may provide further advantages, e.g., by causing the electromagnetic coupling from the first amplifier 112 and the first balun 116 to apply evenly to the first coil 202 and the second coil 204. The first balun 116 may be positioned in the same layer as the first coil 202 and the second coil 204. Alternatively, the first balun 116 may be positioned in a different layer than the first coil 202 and the second coil 204. Some embodiments may be similar to the embodiments shown in FIG. 9 or 10, but with the first balun 116 flipped 180° with regards to the first amplifier 112, such that the solid line terminals are coupled to the first amplifier 112 and the dashed line terminals are furthest from the first amplifier 112.

The above description may also apply to transmitters, receivers, or oscillator circuits.

While only these examples of VCO circuits are shown, this description may apply to any other suitable oscillator circuit. For example, while only two variable-capacitances are shown, any number of variable-capacitances may exist in the circuit. Another example is that while the transistors are shown as being n-type MOSFETs, a p-type MOSFET equivalent circuit may be used instead.

The above description of illustrated examples, implementations, aspects, etc., of the subject description, including what is described in the Abstract, is not to be exhaustive or to limit the described aspects to the precise forms described. While specific examples, implementations, aspects, etc., are described herein for illustrative purposes, various modifications are possible that are considered within the scope of such examples, implementations, aspects, etc., as those skilled in the relevant art can recognize.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are illustrated and/or described herein, other transistors (or equivalent switching devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" may be understood as one or more circuits that are: (i) incorporated in/over a semiconductor substrate; (ii) incorporated in a single semiconductor package; (iii) incorporated into the same module; and/or (iv) incorporated in/on the same printed circuit board.

Example embodiments of the present disclosure are summarized here. Other embodiments can also be understood from the entirety of the specification and the claims filed herein.

Example 1. A device including: a first coil including a first plurality of conductive loop segments that are concentric with one another and centered on a first axis, the first coil including first and second terminals, and a center tap disposed between the first and second terminals of the first coil, where the first axis is spaced laterally from a first side of a plane by a first distance, the first axis extending in parallel with the plane; a second coil including a second plurality of conductive loop segments that are concentric with one another and centered on a second axis, the second coil including first and second terminals, and a center tap disposed between the first and second terminals of the second coil, the second axis extending in parallel with the first axis and spaced laterally from a second side of the plane by the first distance, the second side being opposite the first side; a first conductive segment electrically directly connecting the first terminal of the first coil to the first terminal of the second coil; and a second conductive segment electrically directly connecting the second terminal of the first coil to the second terminal of the second coil.

Example 2. The device of example 1, where the first and second coils are planar coils.

Example 3. The device of one of examples 1 or 2, where the first coil is symmetric to the second coil about the plane.

Example 4. The device of one of examples 1 to 3, where the first and second conductive segments are disposed on a same layer of an integrated circuit.

Example 5. The device of one of examples 1 to 4, where the first and second conductive segments are disposed on a same layer of a printed circuit board (PCB).

Example 6. The device of one of examples 1 to 5, where the center tap of the first coil is disposed on a side opposite the second coil, and where the center tap of the second coil is disposed on a side opposite the first coil.

Example 7. The device of one of examples 1 to 6, where an inner diameter of the first coil is equal to an inner diameter of the second coil.

Example 8. The device of one of examples 1 to 7, where the second conductive segment is parallel to the first conductive segment.

Example 9. The device of one of examples 1 to 8, further including: a first voltage-controlled oscillator (VCO) having first circuit elements disposed in an area between the first and second conductive segments; and a second voltage-controlled oscillator (VCO) having second circuit elements disposed in an area between the first and second conductive segments.

Example 10. The device of one of examples 1 to 9, where the first circuit elements include: a first transistor having a control terminal and an output terminal, the output terminal coupled to the first conductive segment, the control terminal coupled to the second conductive segment; a first capacitor having a first terminal coupled to the first conductive segment, and where the second circuit elements include: a second transistor having a control terminal coupled to the first conductive segment, the second transistor further having an output terminal coupled to the second conductive segment; and a second capacitor coupled between the first capacitor and the second conductive segment.

Example 11. The device of one of examples 1 to 10, where the first coil includes a first plurality of conductive structures that couple the first plurality of conductive loop segments to each other, the second coil includes a second plurality of conductive structures that couple the second plurality of conductive loop segments to each other, and where the first plurality of conductive structures are symmetric to the second plurality of conductive structures about the plane.

Example 12. The device of one of examples 1 to 11, further including: a balun that is symmetric about the plane, the balun being positioned in a same layer as the first coil.

Example 13. The device of one of examples 1 to 12, further including: a balun that is positioned in a same layer as the first coil, and where the balun is asymmetric with regards to the plane.

Example 14. The device of one of examples 1 to 13, further including: a balun that is centered on a third axis, where the first axis and the second axis are equidistant from the third axis.

Example 15. The device of one of examples 1 to 14, further including an amplifier disposed between the first conductive segment and the balun.

Example 16. The device of one of examples 1 to 15, further including: a power amplifier having first and second outputs; and a balun having first and second input segments respectively coupled to the first and second outputs of the power amplifier, where the first input segment of the balun is parallel to the second input segment of the balun and to the first conductive segment.

Example 17. The device of one of examples 1 to 16, further including a balun, where a distance between an edge of the balun and an edge of the first coil is less than 300 μm.

Example 18. A device including: a first oscillator disposed in a substrate; a second oscillator disposed in the substrate; and an inductive structure including: a first loop disposed within the substrate and electrically coupled to the first oscillator, and a second loop disposed within the substrate and electrically coupled to the second oscillator, where the second loop is electrically shorted to the first loop, where a first circuit element of the first oscillator is disposed in a first area that is within the inductive structure, and where a second circuit element of the second oscillator is disposed within a second area that is within the inductive structure.

Example 19. The device of example 18, where the first circuit element is a first transistor, and where the second circuit element is a second transistor.

Example 20. The device of one of examples 18 or 19, where the first circuit element is a first capacitor, and where the second circuit element is a second capacitor.

Example 21. The device of one of examples 18 to 20, where the first area is adjacent to the second area.

Example 22. The device of one of examples 18 to 21, where the first area is within the first loop, and the second area is within the second loop.

Example 23. The device of one of examples 18 to 22, further including: a first conductive segment coupling the first loop to the second loop; and a second conductive segment coupling the first loop to the second loop, the second conductive segment crossing over the first conductive segment.

Example 24. The device of one of examples 18 to 23, further including: a first conductive segment coupling the first loop to the second loop; and a second conductive segment coupling the first loop to the second loop, the second conductive segment being spaced apart from the first conductive segment.

Example 25. The device of one of examples 18 to 24, where the first oscillator includes a first transistor and a first capacitor, where the first transistor and the first capacitor are laterally surrounded by a combination of the first loop, the second loop, the first conductive segment, and the second conductive segment.

Example 26. The device of one of examples 18 to 25, where the second oscillator includes a second transistor and a second capacitor, where the second transistor and the second capacitor are laterally surrounded by a combination of the first loop, the second loop, the first conductive segment, and the second conductive segment.

Example 27. The device of one of examples 18 to 26, further including: an amplifier disposed in the substrate and having an input coupled to the inductive structure.

Example 28. The device of one of examples 18 to 27, further including: a balun disposed in the substrate, where the balun and the amplifier are symmetrically mirrored across a plane.

Example 29. The device of one of examples 18 to 28, where the balun has an input coupled to an output of the amplifier.

Example 30. The device of one of examples 18 to 29, further including: a balun disposed in the substrate and having an input coupled to an output of the amplifier, where the combination of the balun and the amplifier is asymmetric across a plane.

Example 31. The device of one of examples 18 to 30, where the first loop is symmetric to the second loop about a plane.

Example 32. The device of one of examples 18 to 31, where the first oscillator is symmetric to the second oscillator.

Example 33. A device including: a transmit path including: a first mixer; a first amplifier having an input coupled to an output of the first mixer; and a transformer having an input coupled to an output of the first amplifier; and a phase locked loop (PLL) having an output coupled to the first mixer, where the PLL includes a first coil and a second coil, and where a center of the transformer is equidistant from respective centers of the first and second coils.

Example 34. The device of example 33, further including a receive path that includes a second transformer coupled to a second amplifier, and a second mixer having an input coupled to an output of the second amplifier, where the PLL is coupled to the second mixer.

Example 35. The device of one of examples 33 or 34, further including an antenna coupled to the transformer and to the second transformer.

Example 36. The device of one of examples 33 to 35, where the PLL is configured to generate a signal at the output of the PLL, the signal having a first frequency, where the transformer is configured to operate at a second frequency, the first frequency being an integer multiple greater than 1 of the second frequency.

Example 37. The device of one of examples 33 to 36, where the first frequency is 4.8 GHz, and the second frequency is 2.4 GHz.

Example 38. The device of one of examples 33 to 37, further including a clock generator having an output, where the PLL includes an input coupled to an output of the clock generator, and where the output of the clock generator is coupled to the input of the PLL without any intervening mixer.

Example 39. The device of one of examples 33 to 38, where the PLL includes an oscillating circuit that is laterally surrounded by the first coil and the second coil.

Example 40. The device of one of examples 33 to 39, where the oscillating circuit includes a first voltage-controlled oscillator (VCO) and a second VCO, where the first VCO is symmetrically mirrored across from the second VCO.

Example 41. The device of one of examples 33 to 40, further including: an antenna coupled to the first amplifier, where the antenna is configured to operate at a first frequency, and where the PLL is configured to operate at an integer multiple of the first frequency.

Example 42. The device of one of examples 33 to 41, where the first coil, the second coil, and the transformer are positioned in a same layer within a substrate.

Example 43. The device of one of examples 33 to 42, where the transformer is a balun.

Example 44. A device, including: a first planar coil including a first plurality of conductive loop segments that are concentric with one another and centered on a first axis, the first axis spaced laterally from a first side of a plane by a first distance, and the first axis extending in parallel with the plane; and a second planar coil coupled to the first planar coil, the second planar coil including a second plurality of conductive loop segments that are concentric with one another and centered on a second axis, the second axis extending in parallel with the first axis and spaced laterally from a second side of the plane by the first distance, the second side being opposite the first side, where the first planar coil is symmetric to the second planar coil about the plane.

Example 45. A device including: an amplifier disposed in a substrate and having an input; a first oscillator disposed in the substrate and having an output coupled to the input of the amplifier; a second oscillator disposed in the substrate and having an output coupled to the input of the amplifier; a first loop disposed within the substrate, the first loop coupled to the first oscillator; and a second loop disposed within the substrate and coupled to the first loop, the second loop coupled to the second oscillator, and symmetric to the first loop about a plane, where the first oscillator and the second oscillator are arranged symmetrically distributed across the plane.

Example 46. A system including: a digital circuit having an output terminal; a mixer having a first input terminal, a second input terminal, and an output terminal, the first input terminal of the mixer coupled to the output terminal of the digital circuit; an amplifier having an input terminal, a first output terminal, and a second output terminal, the input terminal of the amplifier coupled to the output terminal of the mixer; a transformer having a first input terminal, a second input terminal, and an output terminal, the first input terminal of the transformer coupled to the first output terminal of the amplifier, the second input terminal of the transformer coupled to the second output terminal of the amplifier, the output terminal of the transformer coupled to an antenna terminal; and a phase locked loop (PLL) having an output terminal coupled to the second input terminal of the mixer, and where the phase locked loop includes a first coil and a second coil, where a center of the first coil is spaced from a center of the transformer by a first distance, a center of the second coil is spaced from the center of the transformer by a second distance, and where an absolute difference between the first distance and the second distance is less than 10 micrometers.

Unless otherwise stated, "about," "approximately," or "substantially" preceding a value means+/−10 percent of the stated value, or, if the value is zero, a reasonable range of values around zero. Modifications are possible in the described examples, and other implementations are possible, within the scope of the claims.

What is claimed is:

1. A device comprising:

a first coil including a first plurality of conductive loop segments that are concentric with one another and centered on a first axis, the first coil comprising first and second terminals, and a center tap disposed between the first and second terminals of the first coil, wherein the first axis is spaced laterally from a first side of a plane by a first distance, the first axis extending in parallel with the plane;

a second coil including a second plurality of conductive loop segments that are concentric with one another and centered on a second axis that is different from and parallel to the first axis, the second coil comprising first and second terminals, and a center tap disposed between the first and second terminals of the second coil, the second axis extending in parallel with the first axis and spaced laterally from a second side of the plane by the first distance, the second side being opposite the first side;

a first conductive segment electrically directly connecting the first terminal of the first coil to the first terminal of the second coil; and a second conductive segment electrically directly connecting the second terminal of the first coil to the second terminal of the second coil;

wherein the first coil and the second coil are symmetrical about opposite sides of a third axis that is perpendicular to the first and second axes.

2. The device of claim 1, wherein the first and second coils are planar coils.

3. The device of claim 1, wherein the first coil is symmetric to the second coil about the plane.

4. The device of claim 1, wherein the first and second conductive segments are disposed on a same layer of an integrated circuit.

5. The device of claim 1, wherein the first and second conductive segments are disposed on a same layer of a printed circuit board (PCB).

6. The device of claim 1, wherein the center tap of the first coil is disposed on a side opposite the second coil, and wherein the center tap of the second coil is disposed on a side opposite the first coil.

7. The device of claim 1, wherein an inner diameter of the first coil is equal to an inner diameter of the second coil.

8. The device of claim 1, wherein the second conductive segment is parallel to the first conductive segment.

9. The device of claim 1, further comprising:

a first voltage-controlled oscillator (VCO) having first circuit elements disposed in an area between the first and second coils; and a second voltage-controlled oscillator (VCO) having second circuit elements disposed in an area between the first and second coils.

10. The device of claim 9, wherein the first circuit elements comprise:

a first transistor having a control terminal and an output terminal, the output terminal coupled to the first conductive segment, the control terminal coupled to the second conductive segment;

a first capacitor having a first terminal coupled to the first conductive segment, and wherein the second circuit elements comprise:

a second transistor having a control terminal coupled to the first conductive segment, the second transistor further having an output terminal coupled to the second conductive segment; and a second capacitor coupled between the first capacitor and the second conductive segment.

11. The device of claim 1, wherein the first coil includes a first plurality of conductive structures that couple the first plurality of conductive loop segments to each other, the second coil includes a second plurality of conductive structures that couple the second plurality of conductive loop segments to each other, and wherein the first plurality of conductive structures are symmetric to the second plurality of conductive structures about the plane.

12. The device of claim 1, further comprising:

a balun that is symmetric about the plane, the balun being positioned in a same layer as the first coil.

13. The device of claim 1, further comprising:

a balun that is positioned in a same layer as the first coil, and wherein the balun is asymmetric with regards to the plane.

14. The device of claim 1, further comprising:

a balun that is centered on a third axis, wherein the first axis and the second axis are equidistant from the third axis.

15. The device of claim 14, further comprising an amplifier disposed between the first conductive segment and the balun.

16. The device of claim 1, further comprising:

a power amplifier having first and second outputs; and a balun having first and second input segments respectively coupled to the first and second outputs of the power amplifier, wherein the first input segment of the balun is parallel to the second input segment of the balun and to the first conductive segment.

17. The device of claim 1, further comprising a balun, wherein a distance between an edge of the balun and an edge of the first coil is less than 300 μm.

18. A device, comprising:

a first planar coil including a first plurality of conductive loop segments that are concentric with one another and centered on a first axis, the first axis spaced laterally from a first side of a plane by a first distance, and the first axis extending in parallel with the plane; and a second planar coil coupled to the first planar coil, the second planar coil including a second plurality of conductive loop segments that are concentric with one another and centered on a second axis, the second axis extending in parallel with the first axis and spaced laterally from a second side of the plane by the first distance, the second side being opposite the first side, wherein the first coil and the second coil are symmetrical about opposite sides of a third axis that is perpendicular to the first and second axes.

19. A device comprising:

an amplifier disposed in a substrate and having an input;

a first oscillator disposed in the substrate and having an output coupled to the input of the amplifier;

a second oscillator disposed in the substrate and having an output coupled to the input of the amplifier;

a first loop disposed within the substrate including a first plurality of conductive loop segments that are concentric with one another and centered on a first axis, the first loop coupled to the first oscillator; and a second loop disposed within the substrate and coupled to the first loop, the second loop including a second plurality of conductive loop segments that are concentric with one another and centered on a second axis, the second loop coupled to the second oscillator;

wherein the first loop and the second loop are symmetrical about opposite sides of a third axis that is perpendicular to the first and second axes; and wherein the first oscillator and the second oscillator are arranged symmetrically distributed across the plane.

20. A system comprising:

a digital circuit having an output terminal;

a mixer having a first input terminal, a second input terminal, and an output terminal, the first input terminal of the mixer coupled to the output terminal of the digital circuit;

an amplifier having an input terminal, a first output terminal, and a second output terminal, the input terminal of the amplifier coupled to the output terminal of the mixer;

a transformer having a first input terminal, a second input terminal, and an output terminal, the first input terminal of the transformer coupled to the first output terminal of the amplifier, the second input terminal of the transformer coupled to the second output terminal of the amplifier, the output terminal of the transformer coupled to an antenna terminal; and a phase locked loop (PLL) having an output terminal coupled to the second input terminal of the mixer, and wherein the phase locked loop includes a first coil that includes a first plurality of conductive loop segments that are concentric with one another and centered on a first axis and a second coil that includes a second plurality of conductive loop segments that are concentric with one another and centered on a second axis wherein the first loop and the second loop are symmetrical about opposite sides of a third axis that is perpendicular to the first and second axes.

* * * * *